Figure 1:
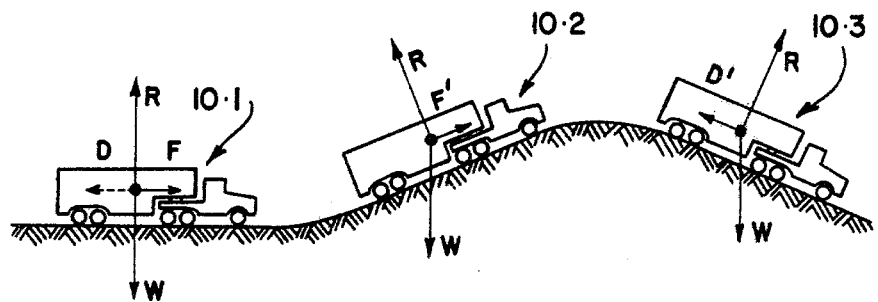

United States Patent [19]

Henderson

[11] 4,308,452
[45] Dec. 29, 1981

[54] MONITORING THE OPERATION OF A VEHICLE

[76] Inventor: Henning M. Henderson, P.O. Box 9597, Johannesburg, South Africa

[21] Appl. No.: 58,994

[22] Filed: Jul. 19, 1979

[30] Foreign Application Priority Data

Jul. 26, 1978 [ZA] South Africa ................ 78/4245

[51] Int. Cl.³ .................................................. G06M 3/12
[52] U.S. Cl. .......................... 235/92 AE; 235/92 TF; 340/52 R; 340/669
[58] Field of Search ........ 235/92 AE, 92 MT, 92 TF, 235/92 TC; 340/669, 52 H, 52 R; 73/491, 516 LM

[56] References Cited

U.S. PATENT DOCUMENTS

| | | | |
|---|---|---|---|
| 2,574,361 | 11/1951 | Vincent | 235/92 AE |
| 3,206,116 | 9/1965 | Short | 235/91 |
| 3,769,844 | 11/1973 | Skoures | 235/92 AE |
| 3,885,324 | 5/1975 | Davenport et al. | 73/516 LM |
| 3,946,359 | 3/1976 | Henderson | 340/52 H |
| 4,092,633 | 5/1978 | Fletcher et al. | 340/669 |
| 4,093,939 | 6/1978 | Mitchell | 340/52 F |
| 4,101,869 | 7/1978 | Henderson | 235/92 AE |

FOREIGN PATENT DOCUMENTS

Z666673 9/1967 South Africa .

*Primary Examiner*—Joseph M. Thesz
*Attorney, Agent, or Firm*—Karl W. Flocks; A. Fred Starobin

[57] ABSTRACT

A method of and apparatus for monitoring the operation of a vehicle comprises sensing means in the form of one or more mercury-containing capsules to sense whether accelerative forces acting on the vehicle in the plane of movement of the vehicle exceed or are less than a predetermined value, a pulse generator operative in response to the sensing means to generate a number of pulses at predetermined intervals when the accelerative forces exceed the predetermined value, an additive memory operative in response to the pulse generator to generate a pulse count representative of the length of time for which the accelerative forces have exceeded the predetermined value, a timer operative to be triggered in response to the sensing means when the accelerative forces exceed the predetermined value, a comparator operative in response to the additive memory and the timer to compare the first signal with a predetermined signal a predetermined period of time after triggering of the timer, and a recorder operative in response to the comparator to make a recording when the first signal is less than said predetermined signal, and not to make a recording when the signal is equal to the predetermined value.

8 Claims, 2 Drawing Figures

MONITORING THE OPERATION OF A VEHICLE

THIS INVENTION relates to a method of and apparatus for monitoring the operation of a vehicle. More particularly, it relates to a method of and apparatus for monitoring the operation of a vehicle, in which accelerative, decelerative or centrifugal forces acting on the vehicle in a plane (herein simply referred to as the plane of movement) parallel to the surface on which the vehicle is supported, are sensed.

As deceleration is negative acceleration in the direction of travel of the vehicle and centrifugal acceleration is acceleration transverse to the direction of travel of the vehicle, accelerative, decelerative, and centrifugal forces acting on the vehicle are, for ease of definition, all referred to herein as 'accelerative' forces.

Applicant is aware of vehicle monitoring devices in which the accelerative forces acting on the vehicle are sensed by pendulum-operated switches or by mercury switches. A difficulty with such switches has been that they are unable to distinguish between true accelerative forces acting on the vehicle, i.e. forces due to changes in the velocity vector of the vehicle in the plane of movement, and gravitational forces acting on the vehicle in this plane when the vehicle is banked or travels up or down an incline. The devices become more sensitive to true accelerative forces when the vehicle is travelling up an incline than they are when the vehicle is travelling along a level road. Likewise, the devices become more sensitive to true decelerative (negative accelerative) forces when the vehicle is travelling down an incline than they are when the vehicle is travelling along a level road. Furthermore, in the case of trucks which have a tippable cab for providing access to the truck's engine, where the device is mounted in the cab, the device will interpret tipping of the cab as heavy acceleration of the truck in some direction, depending on the direction in which the cab is tipped relative to the body of the truck.

It is an object of the invention to provide a method of and apparatus for monitoring the operation of a vehicle wherein accelerative forces on the vehicle in the plane of movement are sensed, whereby, to a certain extent under average operating conditions, true accelerative forces and gravitational forces acting on the vehicle in the plane of movement, can be distinguished.

According to the invention, there is provided a method of monitoring the operation of a vehicle, in which accelerative forces acting on the vehicle in a plane parallel to the surface on which the vehicle is supported, are sensed, which method comprises sensing over a predetermined length of time whether such accelerative forces exceed or are less than a predetermined value; and depending on whether such accelerative forces have exceeded the predetermined value for less than or the whole of the predetermined length of time, respectively making a recording, or desisting from making a recording.

If the accelerative forces have exceeded the predetermined value for less than the predetermined length of time, a recording in the form of one or more unit counts may be made, the number of counts recorded depending on the length of time for which the accelerative forces have exceeded the predetermined value during the predetermined length of time.

The invention is based on the principle that, when the vehicle travels up or down an incline, or is banked, the gravitational forces acting as a result thereof on the vehicle in the plane of movement, are generally sustained for longer than a certain minimum time period. On the other hand, true accelerative forces acting on the vehicle in the plane of movement, cannot generally be, or are not generally maintained for longer than such minimum period of time as, by that time, in the case of forward or positive acceleration, the vehicle would have speeded up to a speed at which its engine has insufficient power to speed it up further, or, in the case of negative acceleration or deceleration, the vehicle would have come to a standstill, or, in the case of centrifugal acceleration, the vehicle would have to travel around in circles.

Warning signals may be issued at short intervals of time while the accelerative forces on the vehicle exceed the predetermined value, and at the end of the predetermined time, if the accelerative forces on the vehicle have exceeded the predetermined value for less than the predetermined length of time, the number of signals issued during the predetermined length of time may be recorded as unit counts.

Although it will be appreciated that the method of the invention will not be able to eliminate absolutely any recording due to gravitational forces acting on the vehicle in the plane of movement, or will always cause a recording to be made when true accelerative forces are being experienced, the applicant has found that, by using a predetermined time period of between about 5 and 10 seconds, and preferably about 10 seconds, a workable distinction can be made between true accelerative forces and gravitational forces under the average operating conditions of a vehicle.

The invention extends to apparatus for monitoring the operation of a vehicle, which apparatus comprises sensing means for sensing whether accelerative forces acting on the vehicle in a plane parallel to the surface on which the vehicle is supported exceed or are less than a predetermined value;

an accumulator operative in response to the sensing means to provide a first signal representative of the length of time for which said accelerative forces have exceeded the predetermined value;

a timer operative to be triggered in response to the sensing means when the accelerative forces exceed said predetermined value;

a comparator operative in response to the accumulator and the timer to compare the first signal with a predetermined signal a predetermined period of time after triggering of the timer; and a recorder operative in response to the comparator to make a recording when the first signal is less than said predetermined signal, and not to make a recording when the signal is equal to the said predetermined value.

The recorder may be operative, when making a recording, to make a recording which is indicative of the magnitude of the first signal.

The accumulator may comprise a pulse generator operative in response to the sensing means to generate pulses at predetermined time intervals for as long as the accelerative forces exceed said predetermined value, and an additive memory operative in response to the pulse generator to count the pulses, said first signal being representative of the number of pulses counted by the additive memory.

The invention extends to a vehicle including apparatus in accordance with the invention as hereinbefore described.

The invention will now be described in more detail, by way of example, with reference to the accompanying diagrammatic drawings.

Figure 2:
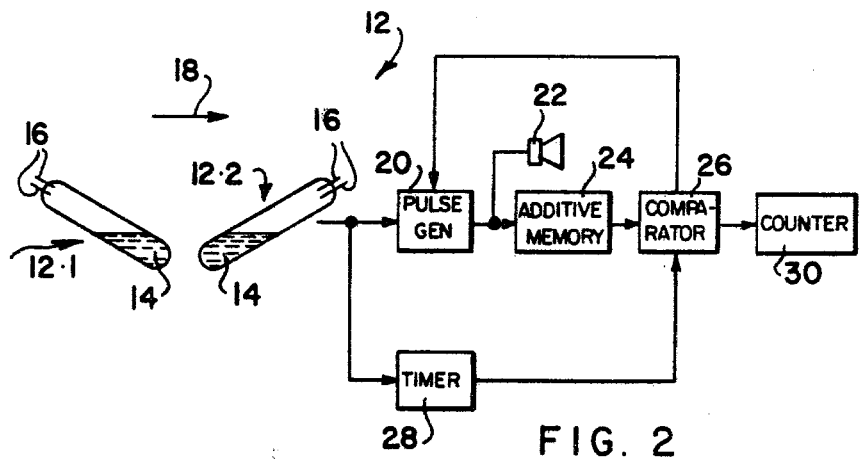

In the drawings;

FIG. 1 illustrates the forces acting on a vehicle when it is travelling along a level road (left hand side of the drawing), when it is travelling up an incline (centre of the drawing), and when it is travelling down an incline (right hand side of the drawing); and FIG. 2 shows a block diagram of apparatus in accordance with the invention, for monitoring the operation of the vehicle.

Referring now to FIG. 1 of the drawings, there is shown at 10.1 a vehicle travelling along a level road. The weight of the vehicle is indicated by vector W, the reaction force of the road on the vehicle by vector R, and the accelerative force applied by the vehicle's engine in the direction of travel by vector F. The accelerative force F is over and above the driving force required to keep the vehicle moving at a steady forward speed. Alternatively, if the vehicle's brakes are applied, then a decelerative force D (shown dotted) will be applied to the vehicle.

Reference numeral 10.2 indicates the vehicle when it is travelling up an incline. In this case an accelerative force F′ over and above the driving force required to keep the vehicle moving at a steady speed along a level road will have to be applied by the vehicle's engine in order to keep the vehicle moving up the incline at a steady speed.

Reference numeral 10.3 indicates the vehicle when it is travelling down an incline. In this case a decelerative force D′ will have to be applied to the vehicle by its brakes in order to keep the vehicle moving down the incline at a steady speed.

Referring now to FIG. 2, there is shown a monitoring device 12 for monitoring the operation of the vehicle. The monitoring device 12 includes sensing means comprising two glass capsules 12.1 and 12.2 each containing a quantity of mercury 14 and having a pair of electrodes 16. The capsules 12.1 and 12.2 are installed in the vehicle at an angle in a longitudinally extending vertical plane. The capsule 12.1 is adapted to sense accelerative forces in the direction of travel 18 of the vehicle, whereas the capsule 12.2 is adapted to sense decelerative forces with the vehicle moving in that direction or, in other words, accelerative forces in a direction opposite to the direction 18.

The monitoring device 12 further comprises a pulse generator 20 which is adapted to generate pulses at a frequency of about one pulse per second. There is further provided a loudspeaker 22, an additive memory 24, a comparator 26, a timer 28, and a recorder or counter 30.

The operation of the monitoring device is as follows. When an accelerative force F of sufficient magnitude is applied to the vehicle (whether to increase its speed while it is moving along a level road, or to maintain its speed while it is travelling up an incline), the mercury 14 in the capsule 12.1 will move towards the upper end of the capsule, establishing contact between the electrodes 16. This sets into operation the pulse generator 20 and starts or triggers the timer 28. The pulse generator 20 then issues a series of pulses at a frequency of one pulse per second for as long as there is electrical contact between the electrodes 16 of the capsule 12.1. Each pulse of the pulse generator 20 causes a warning signal (herein also referred to as a 'bleep') to be issued by the loudspeaker 22. Also, the number of bleeps occurring are accumulated or counted and the sum memorised by the additive memory 24.

The timer 28 has a time constant of about ten seconds (this may be adjustable). At the end of the time constant of the timer 28, the number of bleeps which have occurred during the time constant are compared with the number 10 (in the case of a pulse frequency of one pulse per second and a time constant of 10 seconds). If there have been less than 10 bleeps, then the actual number of bleeps that have occurred, as recorded by the memory 24, are fed to the recorder 30 and added to the existing count of the recorder. However, if a full complement of 10 bleeps have occurred during the time constant, then no further counts will be added by the recorder 30 and further operation of the pulse generator 20 will be inhibited until such time as electrical contact between the two electrodes 16 of the capsule 12.1 is again broken. Accordingly, the bleep will stop after 10 seconds.

When electrical contact between the electrodes 16 of the capsule 12.1 is broken again, the timer 28 and the additive memory 24 will be reset and the device will be ready for the next operational cycle of ten seconds as soon as electrical contact between the electrodes 16 is again established.

The operation of the capsule 12.2 is similar to that of the capsule 12.1 except that it is sensitive to decelerative forces on the vehicle instead of accelerative forces in the direction of travel of the vehicle. Accordingly, electrical contact between the electrodes 16 of the capsule 12.2 will be established if the driver of the vehicle brakes excessively or where the vehicle moves downhill as indicated at 10.3 in FIG. 1.

Where the vehicle travels along a level road as indicated at 10.1 in FIG. 1, abusive acceleration or deceleration will be recorded by the monitoring device. This is so because it will never be possible for the driver of the vehicle to sustain such acceleration or deceleration for longer than ten seconds. On the other hand, where the vehicle moves up or down an incline as indicated by reference numerals 10.2 and 10.3 in FIG. 1, then the accelerative or decelerative force on the vehicle required to overcome the gravitational force on the vehicle will almost always be sustained for longer than ten seconds so that no counts will be recorded against the driver under such circumstances. Also, where the vehicle is of the type having a tippable cab and the monitoring device is mounted in the cab, no counts will be recorded when the cab is tipped for maintenance or repair work on the vehicle.

In order to prevent the device from recording counts where the vehicle is gradually coming to the end of an incline or decline, or where the cab is tipped back to its normal position after a repair job, and where, due for example to vibration, contact between the electrodes 16 is intermittently broken during a transition period, the device 12 may be provided with a further timer (not shown). Such further timer will then be operative to delay resetting of the timer 28 and the additive memory 24 for a few seconds so as to allow contact between the electrodes 16 to be broken positively.

The monitoring device 12 may, if desired, comprise two additional glass capsules (not shown) similar to the glass capsules 12.1 and 12.2 but arranged at an angle in a transversely extending vertical plane. Their connection to and co-operation with the rest of the circuitry shown in FIG. 2 will be the same as described in respect of the capsules 12.1 and 12.2. The function of the additional glass capsules will be to sense transverse forces on the vehicle due to the vehicle cornering (i.e. centrifugal forces) or being parked on or driven along a banked road.

What I claim is:

1. A method of monitoring the operation of a vehicle, in which accelerative forces acting on the vehicle in a plane parallel to the surface on which the vehicle is supported, are sensed, which method comprises sensing when such accelerative forces increase beyond a predetermined value and then, over a predetermined length of time thereafter, sensing whether such accelerative forces exceed or are less than the predetermined value; and in response to such sensing, making a recording which is indicative only of the occurrence of such accelerative forces which exceed the predetermined value and endure for less than the predetermined length of time with no recording for accelerative forces which exceed the predetermined value for longer than the predetermined length of time.

2. A method as claimed in claim 1, wherein, if the accelerative forces have exceeded the predetermined value for less than the predetermined length of time, said recording is made in the form of one or more unit counts, the number of counts recorded being indicative of the length of time for which the accelerative forces have exceeded the predetermined value during the predetermined length of time.

3. A method as claimed in claim 2, wherein warning signals are issued at short intervals of time while the accelerative forces on the vehicle exceed the predetermined value and wherein, at the end of the predetermined time, if the accelerative forces on the vehicle have exceeded the predetermined value for less than the predetermined length of time, the number of signals issued during the predetermined length of time are recorded as unit counts so as to provide said recording.

4. A method as claimed in claim 1, wherein the predetermined length of time is in the order of about 5 to 15 seconds.

5. A method as claimed in claim 4, wherein the predetermined length of time is about 10 seconds.

6. Apparatus for monitoring the operation of a vehicle, which apparatus comprises sensing means for sensing whether accelerative forces acting on the vehicle in a plane parallel to the surface on which the vehicle is supported exceed or are less than a predetermined value;

an accumulator operative in response to the sensing means to provide a first signal representative of the length of time for which said accelerative forces have exceeded the predetermined value;

a timer operative to be triggered in response to the sensing means when the accelerative forces increase beyond said predetermined value;

a comparator operative in response to the accumulator and the timer to compare the first signal with a predetermined signal a predetermined period of time after triggering of the timer; and a recorder operative in response to the comparator to make a recording which is indicative only of the occurrence of such accelerative forces which exceed said predetermined value and endure for less than the predetermined length of time.

7. Apparatus as claimed in claim 6, wherein the recorder is operative, when making a recording, to make a recording which is indicative of the length of time for which the accelerative forces have exceeded the predetermined value during the predetermined length of time.

8. Apparatus as claimed in claim 6, wherein the accumulator comprises a pulse generator operative in response to the sensing means to generate pulses at predetermined time intervals for as long as the accelerative forces exceed said predetermined value, and an additive memory operative in response to the pulse generator to count the pulses, said first signal being representative of the number of pulses counted by the additive memory.

* * * * *